(12) United States Patent
Kim

(10) Patent No.: US 6,514,822 B2
(45) Date of Patent: Feb. 4, 2003

(54) METHOD AND SYSTEM FOR REDUCING THINNING OF FIELD ISOLATION STRUCTURES IN A FLASH MEMORY DEVICE

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,692

(22) Filed: Apr. 27, 2001

(65) Prior Publication Data

US 2002/0158284 A1 Oct. 31, 2002

(51) Int. Cl.[7] .......................................... H01L 21/8247
(52) U.S. Cl. ....................................... 438/258; 438/296
(58) Field of Search ................................ 438/257–267, 438/296

(56) References Cited

U.S. PATENT DOCUMENTS

| | | | | |
|---|---|---|---|---|
| 5,420,065 A | * | 5/1995 | Philipossian | |
| 5,989,977 A | * | 11/1999 | Wu | 438/431 |
| 6,150,234 A | * | 11/2000 | Olsen | 438/424 |
| 6,228,727 B1 | * | 5/2001 | Lim et al. | 438/296 |
| 6,265,267 B1 | * | 7/2001 | Huang | 438/258 |

FOREIGN PATENT DOCUMENTS

KR  2001008579 A * 2/2001

* cited by examiner

*Primary Examiner*—Richard Booth
(74) *Attorney, Agent, or Firm*—Sawyer Law Group LLP

(57) ABSTRACT

A method and system for providing a Flash memory device is disclosed. The Flash memory device includes a core and a periphery. The method and system include providing the core for the Flash memory device and providing a plurality of isolation structures. A portion of the plurality of isolation structures is for isolating a plurality of devices at the periphery of the Flash memory device. Each of the plurality of isolation structures includes a corner and an oxide filler. The method and system further include providing the plurality of isolation structures by processing the plurality of isolation structures to reduce thinning of the oxide filler in proximity to the corner of the isolation structure.

6 Claims, 5 Drawing Sheets

METHOD AND SYSTEM FOR REDUCING THINNING OF FIELD ISOLATION STRUCTURES IN A FLASH MEMORY DEVICE

FIELD OF THE INVENTION

The present invention relates to semiconductor devices, and more particularly to a method and system for fabricating isolation structures in Flash memory devices.

BACKGROUND OF THE INVENTION

Flash memory devices are semiconductor devices that are used to store data. Typically, a Flash memory device includes a core, which has memory cells, and a periphery, which includes other devices. The devices in the periphery include high voltage devices, such as charge generating circuits, and low voltage devices, such as amplifiers or control circuits. Separating the devices at the periphery, as well as the cells at the core, are isolation structures. Typically, these isolation structures are semiconductor trench isolation structures.

FIG. 1 depicts a conventional method 10 for providing conventional structures at the periphery of the Flash memory device. The conventional method provides conventional trenches where the isolation structures are desired, via step 12. The conventional trenches are then filled with a conventional oxide filler, via step 14. Typically, steps 12 and 14 are performed for both the core and the periphery. Thus, after step 14 is completed, isolation structures including an oxide filler will be present in both the core and the periphery. An oxide layer is then provided, via step 16. Typically, the oxide layer is approximately fifty Angstroms thick. Note that between steps 14 and 16, processing of the core is carried out. For example, an oxide-nitride-oxide layer may be formed. In addition, certain portions of the core, such as the tunneling barrier for memory cells in the core, are fabricated. Note that for some conventional Flash memory devices, the tunneling barrier is provided by a nitride oxide, such as $N_2O$. However, during many of these processing steps, the periphery is typically not masked. Thus, the $N_2O$ will also be present at the periphery of the Flash memory device. Thus, the periphery of the Flash memory device is etched to reduce any remnant nitride, via step 18. The nitride might remain from fabrication of the tunneling barrier in the core, discussed above. The core of the conventional Flash memory device is then masked, via step 20. Thus, the periphery remains exposed after step 20. A gate oxide is then provided for a portion of the devices at the periphery of the conventional Flash memory device, via step 22. The gate oxide provided in step 22 is preferably a high voltage device gate oxide having a thickness of approximately 145 Angstroms. A portion of the periphery is then etched to remove the high voltage gate oxide, via step 24. This portion of the periphery includes low voltage devices, such as controllers or amplifier circuits. A low voltage gate oxide is then grown, via step 26. Fabrication of devices at the periphery then continues.

FIG. 2A depict a conventional Flash memory device 30 after fabrication of a portion of the devices at the periphery. The conventional Flash memory device 30 includes a core region 40, a high voltage region 50 and a low voltage region 60. The high voltage region 50 and low voltage region 60 are part of the periphery of the Flash memory device 30 because they are not included in the core 40. The core 40 includes a memory cell 42 having a tunneling barrier 46. The core 40 also includes a conventional isolation structure 44 separating the core 40 from the high voltage area 50. The high voltage area 50 includes a high voltage device 52 and a conventional isolation structure 54. The high voltage device 52 may include devices such as charge generating circuits. The high voltage region 50 also includes a gate oxide 56. The low voltage area 60 includes a low voltage device 62, a conventional isolation structure 64 and a gate oxide 66. Although only one device, one conventional isolation structure and one oxide layer are shown for each region 40, 50 and 60, each region 40, 50 and 60 typically has many isolation structures, devices and other structures.

Although the method 100 functions to provide the conventional Flash memory device 50, one of ordinary skill in the art will readily realize that the conventional Flash memory device 50 is subject to leakage due to degradation of the conventional isolation structures 54 and 64. FIG. 2B depicts a close up view of the conventional isolation structures 54 and 64, and device 62. The conventional isolation structures 54 and 64 include conventional trenches 51 and 61, respectively, that are filled with conventional oxide fillers 53 and 63, respectively. Near the corners 55, 57, 65 and 67 of the conventional isolation structures 54 and 64, the oxide filler 53 and 63 has thinned areas 58, 59 and 68. The thinned areas 58, 59 and 68 reduce the ability of the conventional isolation structures 54 and 64 to insulate devices 54 and 64. As a result, a leakage current can occur through the thinned areas 58, 59 and 68. The leakage current can lower the threshold voltage of devices fabricated near the conventional isolation structures 54 and 64, which adversely affect performance of the conventional Flash memory device 30.

The thinned areas 58, 59 and 68 may occur for a variety of reasons. Typically, silicon wafers having a (100) orientation (shown in FIG. 2B) are used for fabricating conventional Flash memory devices 30. Because the top surface has a (100) orientation, near the corners of the trenches 51 and 61, the exposed silicon has a (111) orientation. The (111) orientation of silicon has a larger number of dangling bonds. Thus, when the oxide filler 53 and 63 is provided in step 14 of the method 10 depicted in FIG. 1, areas near the (111) orientation are thinner. In addition, mechanical stress tends to concentrate at areas where a corner is fabricated. Mechanical stress also tends to cause a thinning of the oxide filler 53 and 63 near the corners 55, 57, 65 and 67 of the conventional isolation structures 54 and 64. In addition, as discussed above, in more recent conventional Flash memory devices, a nitride oxide, such as $N_2O$ is used in forming the gate oxide for the memory cells in the core region 40. When $N_2O$ is used, the thinning that results in the areas 58, 59 and 68 is even more severe. Thus, the problems due to leakage current in the devices 52 and 62 are made worse.

Accordingly, what is needed is a system and method for providing improved isolation structures. The present invention addresses such a need.

SUMMARY OF THE INVENTION

The present invention provides a method and system for providing a Flash memory device. The Flash memory device includes a core and a periphery. The method and system comprise providing the core for the Flash memory device and providing a plurality of isolation structures. A portion of the plurality of isolation structures is for isolating a plurality of devices at the periphery of the Flash memory device. Each of the plurality of isolation structures includes a corner and an oxide filler. The method and system further include providing the plurality of isolation structures by processing the plurality of isolation structures to reduce thinning of the oxide filler in proximity to the corner of the isolation structure.

According to the system and method disclosed herein, the present invention provides isolation structures which are less subject to thinning of the oxide filler near corners. As a result, isolation is improved and leakage current reduced.

DETAILED DESCRIPTION OF THE INVENTION

The present invention relates to an improvement in FLASH memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a Flash memory device. The Flash memory device includes a core and a periphery. The method and system comprise providing the core for the Flash memory device and providing a plurality of isolation structures. A portion of the plurality of isolation structures is for isolating a plurality of devices at the periphery of the Flash memory device. Each of the plurality of isolation structures includes a corner and an oxide filler. The method and system further include providing the plurality of isolation structures by processing the plurality of isolation structures to reduce thinning of the oxide filler in proximity to the corner of the isolation structure.

The present invention will be described in terms of particular methods having certain steps. However, one of ordinary skill in the art will readily recognize that this method and system will operate effectively for other methods having other steps. For example, certain steps will be omitted for clarity. Thus, the method and system are consistent other processes having additional steps. In addition, although the present invention is described in the context of isolation structures for particular devices at the periphery of a Flash memory device, nothing prevent the use of the present invention for isolation structures between other devices and/or in other portions of the Flash memory device, such as in the core of the Flash memory device. Furthermore, the present invention will be described in terms of distinct methods for processing isolation structures. However, one of ordinary skill in the art will readily recognize that these methods can be combined.

Figure 1:
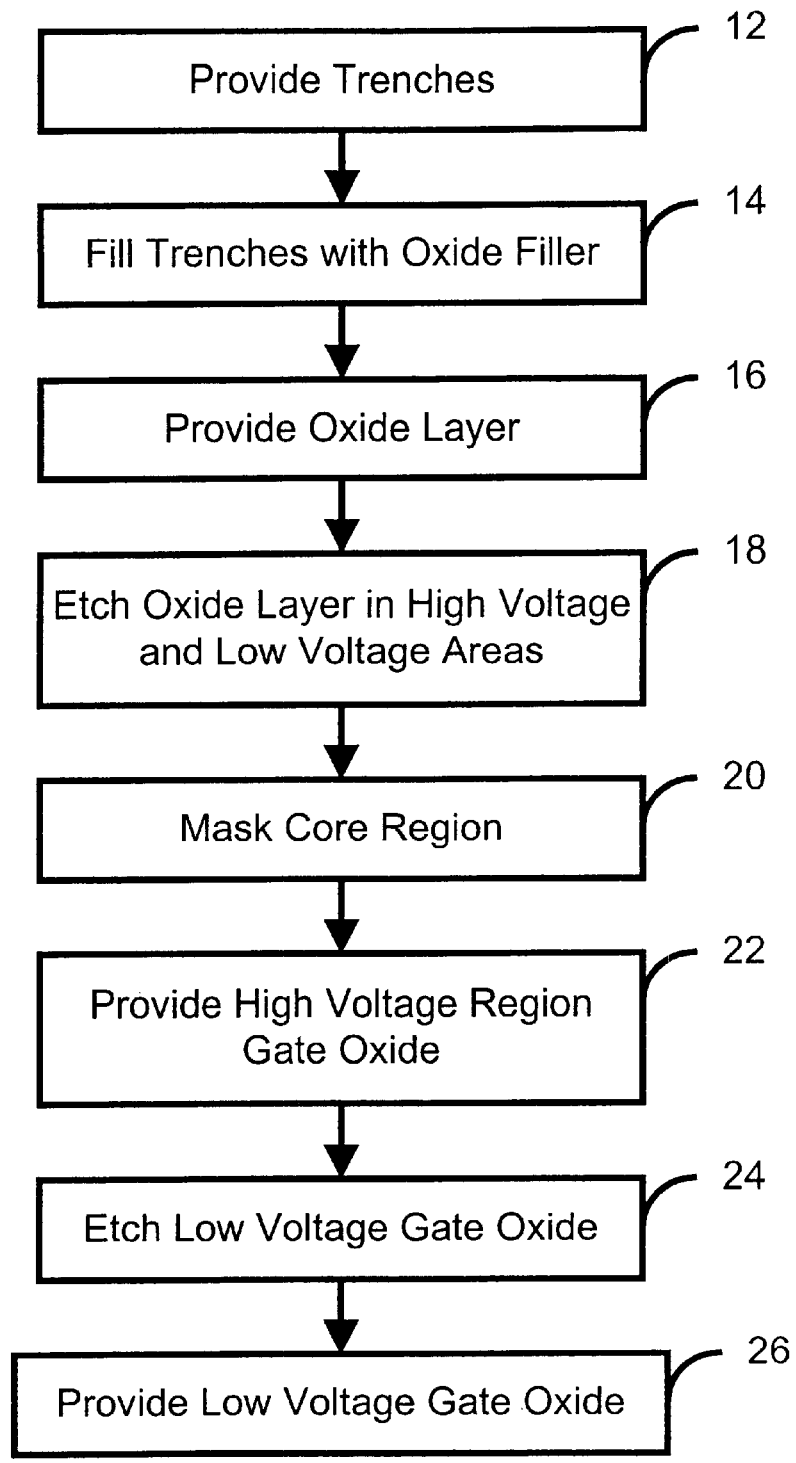
FIG. 1 is a flow chart depicting a conventional method for providing a conventional Flash memory device.
Figure 2A:
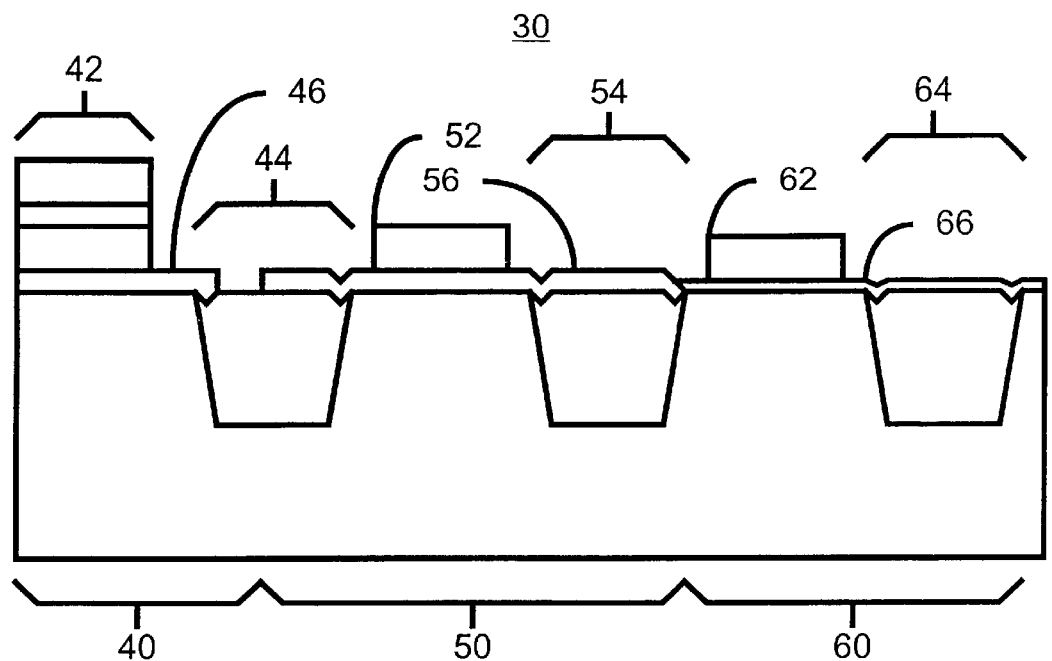
FIG. 2A is a diagram of a portion of a conventional Flash memory device.
Figure 2B:
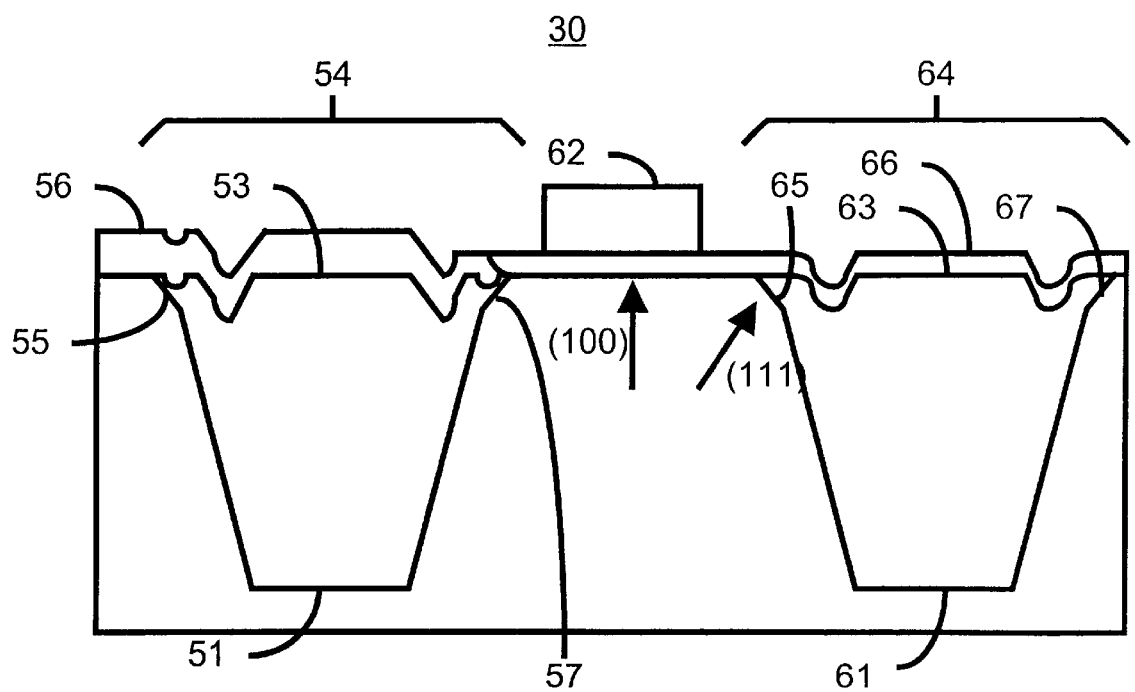
FIG. 2B is an enlarged view of conventional isolation structures at the periphery of the conventional Flash memory device.
Figure 3:
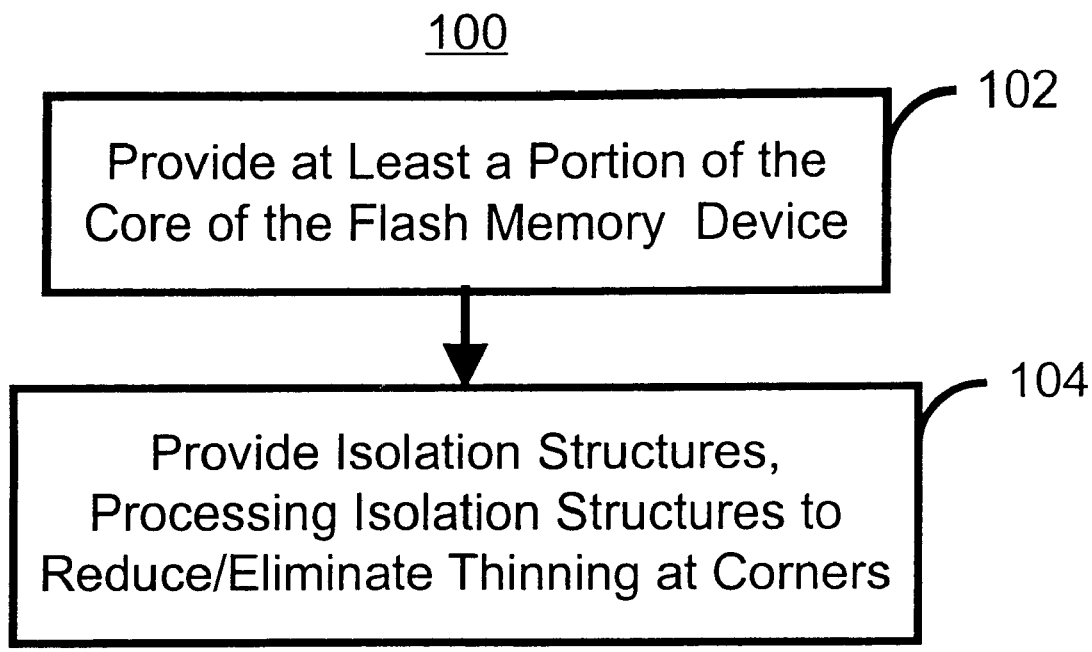
FIG. 3 is a high-level flow chart depicting one embodiment of a method in accordance with the present invention for providing a Flash memory device having improved isolation structures.

To more particularly illustrate the method and system in accordance with the present invention, refer now to FIG. 3, depicting a high-level flow chart one embodiment of a method 100 for providing a Flash memory device in accordance with the present invention. For clarity, certain steps in the method 100 are omitted. At least a portion of the core of the Flash memory device is provided, via step 102. For example, step 102 could include providing isolation structures in the core and/or providing a tunneling barrier or other structures for the memory cells in the core. The isolation structures at the periphery are provided and processed such that thinning of the oxide filler in the isolation structures is reduced or eliminated, via step 104. More particularly, in a preferred embodiment, thinning of the oxide filler at the corners of the isolation structure is reduced eliminated. Note that step 104 could also include providing the isolation structures in the core of the Flash memory device. In such an embodiment, thinning of the oxide filler at the corners of the isolation structure should be reduced or eliminated. Because thinning is reduced or eliminated, the isolation structures provided using the method 100 are better able to insulate devices in the Flash memory device. In other words, leakage current through thinner portions of the isolation structures can thus be made smaller. As a result, the threshold voltage of devices in the Flash memory device, particularly those at the periphery of the Flash memory device, can be maintained. The Flash memory device may thus be better able to function as desired.

Figure 4:
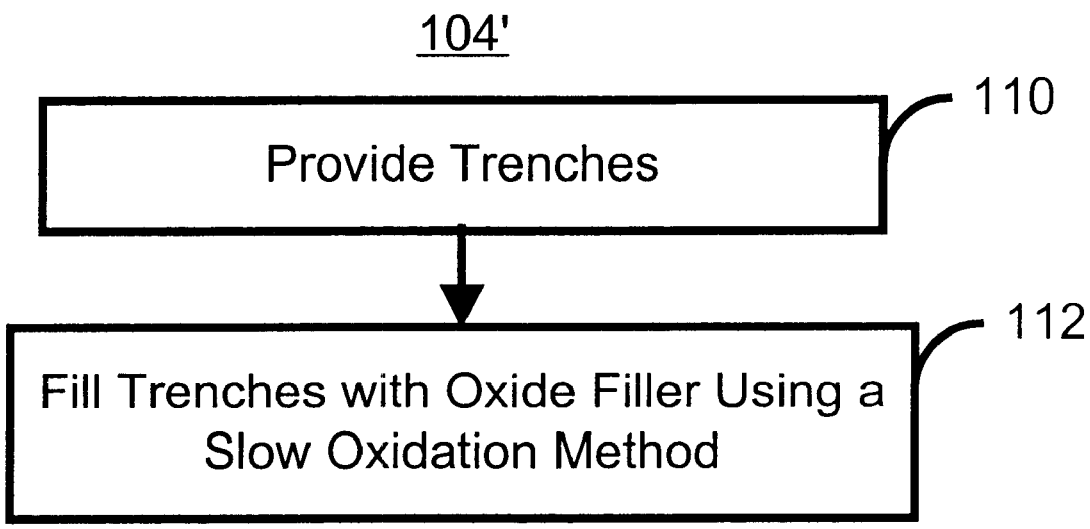
FIG. 4 is a more detailed flow chart of a first embodiment of a method in accordance with the present invention for processing the isolation structures to reduce thinning.

FIG. 4 is a more detailed flow chart of a first embodiment of a method 104' in accordance with the present invention for processing the isolation structures to reduce thinning of the oxide filler. The trenches for the isolation structures are provided, via step 110. The oxide filler is then provided in the trenches using a slow oxidation method, via step 112. In a preferred embodiment, the slow oxidation method includes providing an oxide using $KrO_2$ as a chemical source for the oxidation. Because the growth rate of the oxide filler is lower, the coverage of the oxide filler in the trench is more even. Consequently, the tendency of the oxide filler to have thinned portions at the corners of the isolation structure is reduced. Because the oxide filler is not thinned, the isolation structures are less likely to have a leakage current.

Figure 5:
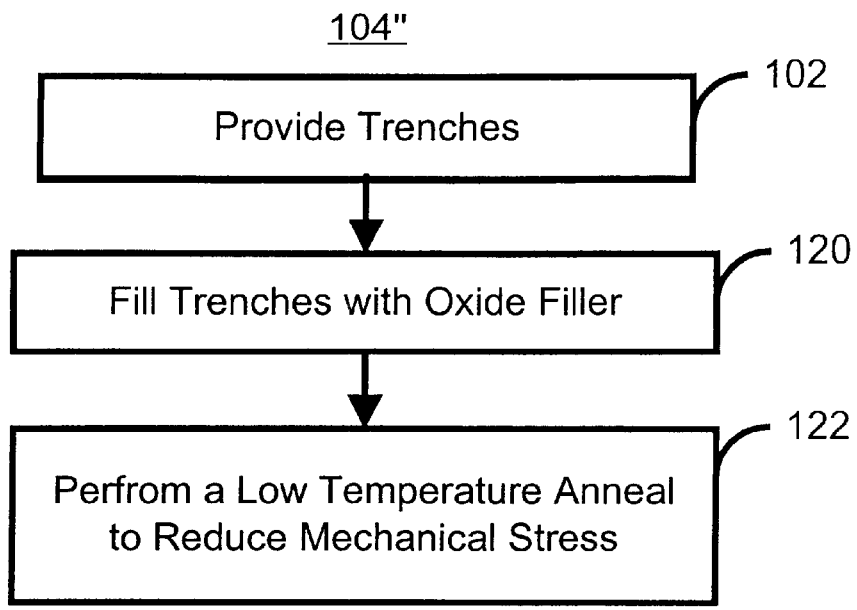
FIG. 5 is a more detailed flow chart of a second embodiment of a method in accordance with the present invention for processing the isolation structures to reduce thinning.

FIG. 5 is a more detailed flow chart of a second embodiment of a method 104" in accordance with the present invention for processing the isolation structures to reduce thinning of the oxide filler. Trenches for the isolation structures are provided, via step 120. The trenches are then filled with the oxide filler, via step 122. A low temperature anneal is then provided, via step 124. In one embodiment, the anneal temperature is less than one thousand degrees centigrade. In a preferred embodiment, the anneal temperature is approximately eight hundred and fifty degrees centigrade.

Also in a preferred embodiment, the anneal is performed for approximately thirty seconds.

Because the anneal is provided, mechanical stress at the corners of the isolation structure can be released. Thus, the quality of the oxide filler grown improves. The anneal can also increase the density of the oxide filler, making the oxide filler less likely to be thinned near the corners of the isolation structure. As a result, leakage current is less likely to occur through the isolation structure. In addition, because the anneal is performed at a low temperature, the devices in the Flash memory device are not adversely affected. For example, an anneal at a higher temperature could cause the source and drain of memory cells in the core of the Flash memory device to diffuse. Thus, the isolation structures can be improved without sacrificing other portions of the Flash memory device. Consequently, the performance of the Flash memory device is improved.

Figure 6:
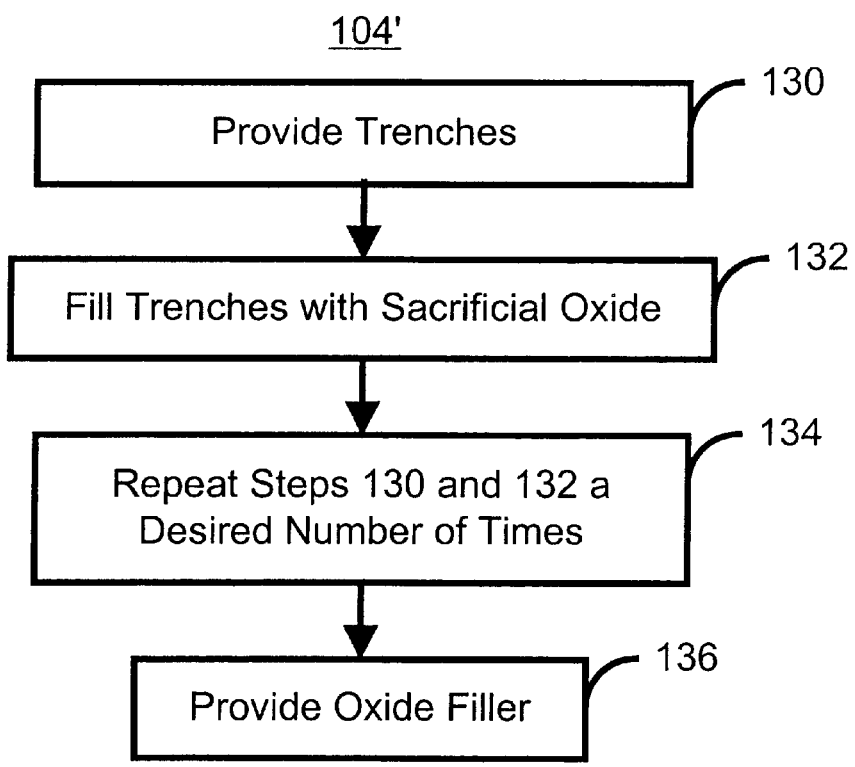
FIG. 6 is a more detailed flow chart of a third embodiment of a method in accordance with the present invention for processing the isolation structures to reduce thinning.

FIG. 6 is a more detailed flow chart of a third embodiment of a method 104" in accordance with the present invention for processing the isolation structures to reduce thinning of the oxide filler. Trenches for the isolation structures are provided, via step 130. The trenches are filled with a sacrificial oxide, via step 132. The sacrificial oxide is then etched, via step 134. Steps 132 and 134 can then be repeated a particular number of times, via step 136. In a preferred embodiment, the particular number of times is zero times. However, in another embodiment, the particular number of times is greater than zero. The trench is then filled with the oxide filler, via step 138.

During removal of the sacrificial oxide in step 134, a portion of the semiconductor forming the walls and corners of the trench are also removed. As a result, the corners of the trench are rounded. Because the corners are rounded, mechanical stress is less likely to accumulate at the corners. As a result, the oxide filler provided in step 138 is of a higher quality and is less likely to be thinned near the corners of the isolation structure. Consequently, the Flash memory device is less likely to suffer a leakage current through the isolation structures.

Thus, the methods 104', 104" and 104''' improve the isolation structures by reducing thinning near the corners of the isolation structures. Although each of the methods 104', 104" and 104''' function separately, any combination of the methods 104', 104" and 104''' can be used to improve the quality of the isolation structures.

Figure 7A:
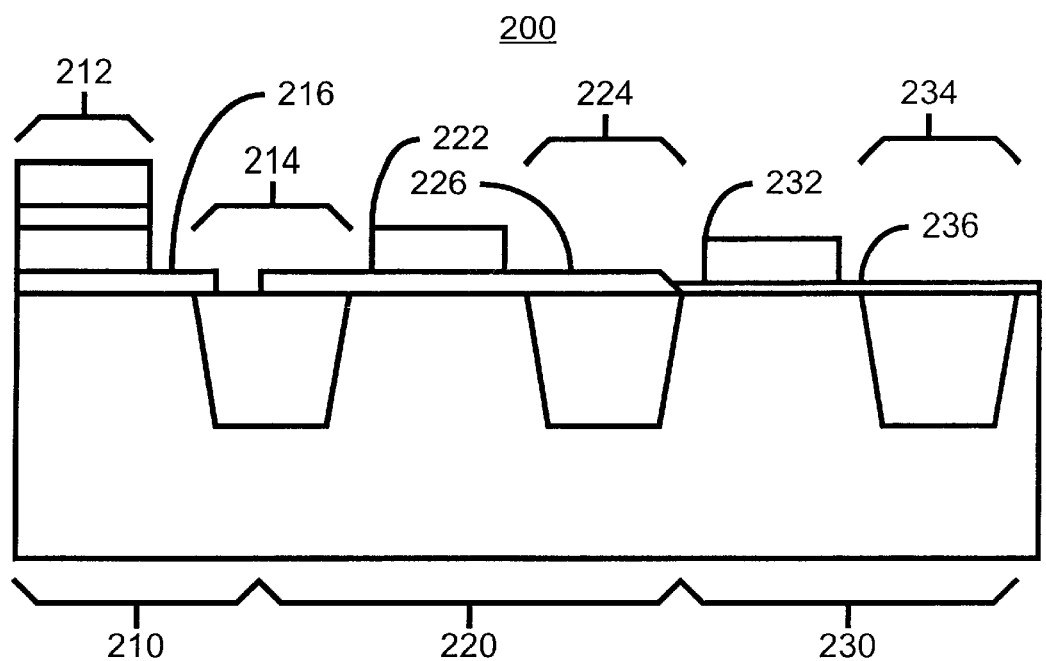
FIG. 7A depicts one embodiment of a portion of a Flash memory device in accordance with the present invention.

FIG. 7A depicts one embodiment of a portion of a Flash memory device 200 in accordance with the present invention. Note that although single structures are shown in the Flash memory device 200, the Flash memory device 200 includes multiple structures. For example, although only one isolation structure 224 is shown in the high voltage region 220, the Flash memory device 200 preferably includes multiple isolation structures in the high voltage region 220. The Flash memory device 200 includes a core region 210, a high voltage region 220 and a low voltage region 230. The high voltage region 220 and the low voltage region 230 are part of the periphery of the Flash memory device 200. The core region 210 includes memory cell 212 including a tunneling barrier 216, which may be formed using $N_2O$. The core 210 also includes an isolation structure 214. The high voltage region 220 includes a high voltage device 222 and an isolation structure 224. The gate oxide 226 for the device 222, which can be formed using conventional means, is also depicted. The high voltage device 222 could include devices such as charge generating circuits. The low voltage region 230 includes a low voltage device 232, an isolation structure 234 and a gate oxide 236, which can be formed using conventional means. Generally, the gate oxide 226 is approximately one hundred and forty five Angstroms thick and thicker than the gate oxide 236. The isolation structures 224 and 234 are formed using the methods 100, 104', 104" and/or 104'''. In one embodiment, the isolation structure 214 is also formed using the methods 100, 104', 104" and/or 104'''.

Figure 7B:
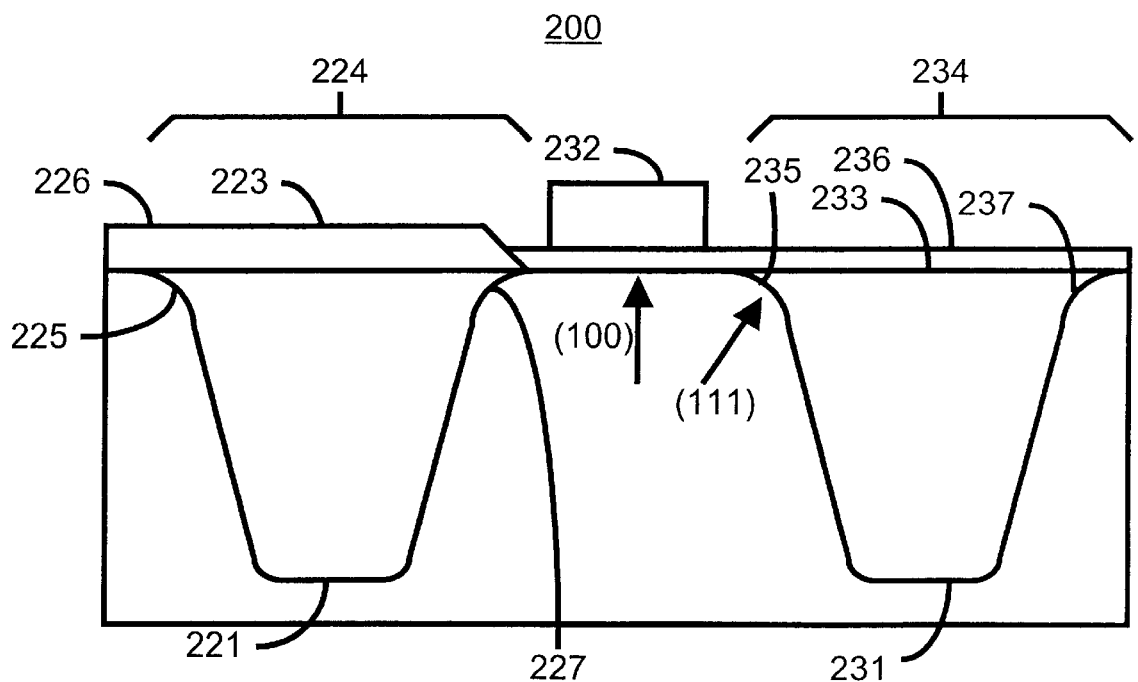
FIG. 7B is a more detailed view of isolation structures in one embodiment of the Flash memory device in accordance with the present invention.

FIG. 7B is a more detailed view of isolation structures in one embodiment of the Flash memory device 100 in accordance with the present invention. The isolation structures 224 and 234 and the how voltage device 232 are shown in FIG. 7B. The isolation structures 224 and 234 include trenches 221 and 231, respectively, and oxide filler 223 and 233, respectively. The isolation structures 224 and 234 include corners 225 and 227 and corners 235 and 237, respectively. The isolation structures 224 and 234 are formed using the methods 104', 104" and 104'''. The corners 225, 227, 235 and 237 are rounded because a sacrificial oxide (not shown) has been provided in and removed from the trenches 221 and 231. Because the oxide filler 223 and 233 are provided using a slow oxidation method, the oxide filler 223 and 233 covers the trenches 221 and 231, respectively, relatively evenly. In addition, because the isolation structures 224 and 234 are annealed at a low temperature, mechanical stress is released from the corners 225, 227, 235 and 237 of the isolation structures 224 and 234. Because of the shape of the corners 225, 227, 235 and 237, the slow growth of the oxide filler 223 and 233 and the anneal, the oxide filler 223 and 233 is less subject to thinning. As a result, the isolation structures 224 and 234 are better able to perform their function of isolating devices in the high voltage region 220 and the low voltage region 230.

A method and system has been disclosed for providing a Flash memory device having improved isolation structures. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a Flash memory device including a core and a periphery, the method comprising the steps of:
   (a) providing the core for the Flash memory device;
   (b) providing a plurality of isolation structures, a portion of the plurality of isolation structures for isolating a plurality of devices at the periphery of the Flash memory device, each of the plurality of isolation structures having a corner and an oxide filler, the step of providing the plurality of isolation structures further including the step of
      (b1) processing the plurality of isolation structures to reduce thinning of the oxide filler in proximity to the corner of the isolation structure, wherein the plurality of isolation structures processing step (b1) further includes the steps of:
         (b1i) providing a sacrificial oxide filler;
         (b1ii) etching the sacrificial oxide filler and a portion of the isolation structure to round the corner of each of the plurality of isolation structures;
         (b1iii) repeating steps (b1) and (b1ii) to further round the corner of each of the plurality of isolation structures a particular number of times; and
         (b1iv) providing the oxide filler.

2. A method for providing a Flash memory device including a core and a periphery, the method comprising the steps of:

(a) providing the core for the Flash memory device;
(b) providing a plurality of isolation structures, a portion of the plurality of isolation structures for isolating a plurality of devices at the periphery of the Flash memory device, each of the plurality of isolation structures having a corner and an oxide filler, the step of providing the plurality of isolation structures further including the step of
  (b1) processing the plurality of isolation structures to reduce thinning of the oxide filler in proximity to the corner of the isolation structure, wherein the plurality of isolation structures processing step (b1) further includes the step of:
    (b1i) providing the oxide filler in an oxidation step having a slow oxidation rate wherein the oxide filler providing step (b1i) further includes the step of:
      (b1ii) providing the oxide filler using a $KrO_2$ plasma.

3. The method of claim 1 wherein the plurality of isolation structures processing step (b1) further includes the step of:
  (b1v) performing a low temperature anneal on the plurality of oxidation structures to release stress in the corner of each of the plurality of isolation structures, the low temperature anneal being performed at a temperature below 1000C.

4. The method of claim 3 wherein the low temperature anneal is performed at a temperature of approximately 850 C.

5. The method of claim 1 wherein the plurality of isolation structures processing step (b1iv) further includes the step of:
  (b1iv-1) providing the oxide filler in an oxidation step having a slow oxidation rate.

6. The method of claim 5 wherein the plurality of isolation structures processing step (b1) further includes the step of:
  (b1v) performing a low temperature anneal on the plurality of oxidation structures to release stress in the corner of each of the plurality of isolation structures, the low temperature anneal being performed at a temperature below 1000 C.

* * * * *